United States Patent
Hokazono et al.

(10) Patent No.: US 12,021,043 B2
(45) Date of Patent: Jun. 25, 2024

(54) SEMICONDUCTOR DEVICE AND METHOD FOR MANUFACTURING SEMICONDUCTOR DEVICE

(71) Applicant: FUJI ELECTRIC CO., LTD., Kawasaki (JP)

(72) Inventors: Hiroaki Hokazono, Hachioji (JP); Ryoichi Kato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 232 days.

(21) Appl. No.: 17/331,013

(22) Filed: May 26, 2021

(65) Prior Publication Data
US 2021/0280534 A1 Sep. 9, 2021

Related U.S. Application Data

(63) Continuation of application No. PCT/JP2020/022499, filed on Jun. 8, 2020.

(30) Foreign Application Priority Data

Jun. 20, 2019 (JP) .................................. 2019-114534

(51) Int. Cl.
*H01L 23/00* (2006.01)
*H01L 21/48* (2006.01)
(Continued)

(52) U.S. Cl.
CPC ........ *H01L 23/562* (2013.01); *H01L 21/4871* (2013.01); *H01L 23/3735* (2013.01);
(Continued)

(58) Field of Classification Search
CPC ............... H01L 23/562; H01L 21/4871; H01L 23/3735; H01L 24/32; H01L 24/40;
(Continued)

(56) References Cited

U.S. PATENT DOCUMENTS

| 8,987,879 | B2 | 3/2015 | Otremba |
| 9,929,111 | B2 | 3/2018 | Mischitz et al. |

(Continued)

FOREIGN PATENT DOCUMENTS

| CN | 107533984 A | 1/2018 |
| DE | 10349477 A1 | 2/2005 |

(Continued)

OTHER PUBLICATIONS

Japanese Office Action dated Jul. 26, 2022 for Japanese Application No. 2021-527615.
(Continued)

*Primary Examiner* — Jasmine J Clark

(57) ABSTRACT

A semiconductor device includes: a first semiconductor chip having a metal layer on a top surface; a first wiring member arranged to face the metal layer; a sintered-metal layer arranged between the metal layer and the first wiring member, having a first region and a plurality of second regions provided inside the first region, the second regions having lower tensile strength than the first region; and a metallic member arranged inside the sintered-metal layer, wherein the second regions of the sintered-metal layer have lower tensile strength than the metal layer of the first semiconductor chip.

14 Claims, 13 Drawing Sheets

(51) Int. Cl.
  *H01L 23/373* (2006.01)
  *H01L 25/00* (2006.01)
  *H01L 25/07* (2006.01)
  *H01L 25/18* (2023.01)

(52) U.S. Cl.
  CPC .............. *H01L 24/32* (2013.01); *H01L 24/40* (2013.01); *H01L 24/73* (2013.01); *H01L 24/83* (2013.01); *H01L 24/84* (2013.01); *H01L 25/072* (2013.01); *H01L 25/18* (2013.01); *H01L 25/50* (2013.01); *H01L 2224/32225* (2013.01); *H01L 2224/40225* (2013.01); *H01L 2224/73263* (2013.01); *H01L 2224/8384* (2013.01); *H01L 2224/8484* (2013.01); *H01L 2924/10272* (2013.01); *H01L 2924/12032* (2013.01); *H01L 2924/12036* (2013.01); *H01L 2924/13055* (2013.01); *H01L 2924/13091* (2013.01); *H01L 2924/15787* (2013.01); *H01L 2924/3512* (2013.01)

(58) Field of Classification Search
  CPC ......... H01L 24/73; H01L 24/83; H01L 24/84; H01L 25/072; H01L 25/18; H01L 25/50
  USPC ....................................................... 257/703
  See application file for complete search history.

(56) References Cited

U.S. PATENT DOCUMENTS

| | | | |
|---|---|---|---|
| 10,410,945 B2 * | 9/2019 | Konno | ................ H01L 23/3735 |
| 2011/0221076 A1 | 9/2011 | Takayama et al. | |
| 2015/0137347 A1 | 5/2015 | Nakako et al. | |
| 2018/0019061 A1 | 1/2018 | Yamaguchi et al. | |
| 2018/0190611 A1 | 7/2018 | Tatsumi et al. | |
| 2019/0371757 A1 | 12/2019 | Murayama | |
| 2020/0194399 A1 | 6/2020 | Tatsumi et al. | |

FOREIGN PATENT DOCUMENTS

| | | | | |
|---|---|---|---|---|
| DE | 102017206925 | A1 | 10/2018 | |
| EP | 3416186 | A1 | 12/2018 | |
| JP | 2006202586 | A | 8/2006 | |
| JP | 2006269682 | A | 10/2006 | |
| JP | 2010245227 | A | 10/2010 | |
| JP | 2010251457 | A | 11/2010 | |
| JP | 2011192695 | A | 9/2011 | |
| JP | 2011238779 | A | 11/2011 | |
| JP | 2012138470 | A | 7/2012 | |
| JP | 2013258122 | A | 12/2013 | |
| JP | 2015216160 | A | 12/2015 | |
| JP | 201826417 | A | 2/2018 | |
| JP | 2018110149 | A | 7/2018 | |
| JP | 2018110149 | A * | 7/2018 | ... H01L 2224/45014 |
| JP | 2018195724 | A | 12/2018 | |
| JP | 2019212759 | A | 12/2019 | |
| WO | 2017002793 | A1 | 1/2017 | |

OTHER PUBLICATIONS

International Search Report dated Aug. 18, 2020 from International Application No. PCT/JP2020/022499, 6 pages.
Written Opinion of the International Searching Authority dated Aug. 18, 2020 from International Application No. PCT/JP2020/022499, 4 pages.
Office Action dated Apr. 3, 2024 issued for the corresponding Chinese Patent Application No. 202080006652.X.

* cited by examiner

5MPa

5μm 7.5MPa

5μm

30MPa
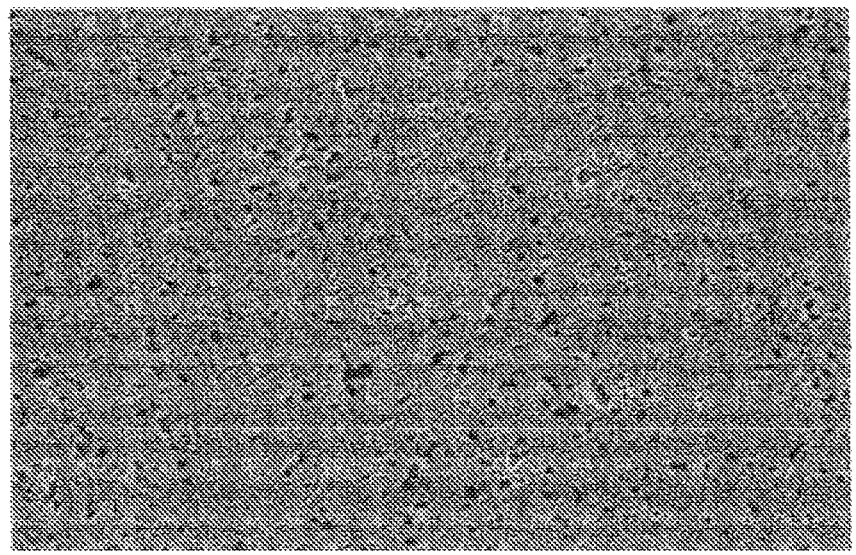
5μm
FIG. 12
50MPa
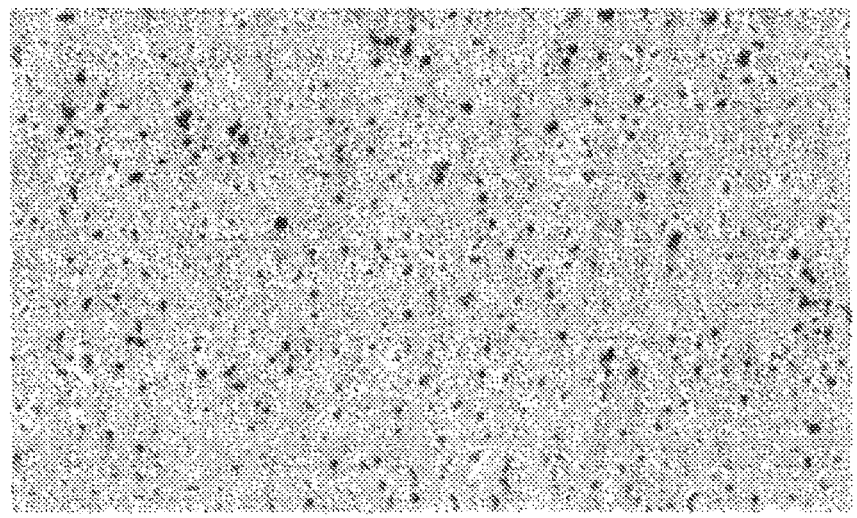
5μm

FIG. 19
Test Piece : Diameter 6mm, Gauge Length 30mm
| Material | Test Temperature | Tensile Strength (MPa) | 0.2% Proof Strength (MPa) |
|---|---|---|---|
| Al (4N) | RT | 61 | 27 |
|  |  | 58 | 27 |
| Al-1.0%Si | RT | 89 | 35 |
|  |  | 89 | 35 |
FIG. 20
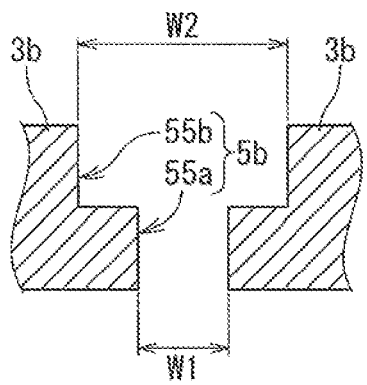
FIG. 21
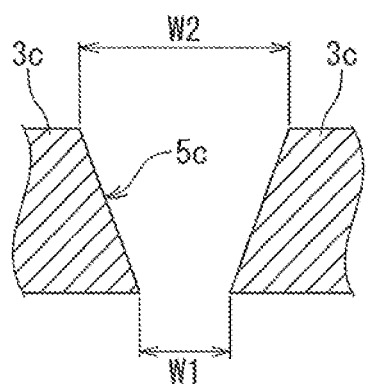

SEMICONDUCTOR DEVICE AND METHOD FOR MANUFACTURING SEMICONDUCTOR DEVICE

CROSS REFERENCE TO RELATED APPLICATIONS

This application is a continuation of International Application No. PCT/JP2020/022499 filed on Jun. 8, 2020, and further claims benefit of priority under 35 USC 119 based on JP2019-114534 filed on Jun. 20, 2019, the entire contents of which are incorporated by reference herein.

BACKGROUND OF THE INVENTION

1. Field of the Invention

The present invention relates to a semiconductor device and a method for manufacturing the semiconductor device.

2. Description of the Related Art

A general power semiconductor device includes a semiconductor element, such as an insulated gate bipolar transistor (IGBT), a MOS field effect transistor (MOSFET) and the like, an insulated circuit board, and a heat dissipation base. A lead frame may be used for joining between the semiconductor element, the insulated circuit board and the heat dissipation base with a joint material, such as a joining wire, a solder, and the like. In recent years, large-scale integration of circuits in power semiconductor devices has been expanding due to the demand for advanced features as well as reduction in size and weight. Further, development for application to a semiconductor device using a semiconductor element such as silicon carbide (SiC) capable of high-temperature operation has been promoted, and high reliability of the semiconductor device in a high-temperature operating environment is required.

A solder, such as tin antimony (SnSb), tin silver (SnAg) and the like, has been applied commonly as the joint material in the semiconductor device. However, as the operating temperature of the semiconductor device rises close to the melting point of the solder, reduced reliability may occur. Therefore, the application of a metal sintering paste or a sintered metal sheet that utilizes sintering of metal particles is being studied as the joint material capable of high-temperature operation. In JP 2012-138470 A, JP 2010-251457 A and JP 2010-245227 A, a structure in which a sintered metal material is used as a joining layer between the semiconductor element, the insulated circuit board and the wiring member has been proposed.

In the power semiconductor device, stress due to differences in thermal expansion coefficients between the members of the device may be generated in the joint layer during energization of the device or by a temperature change in the outer peripheral environment. Repeated stress generation may cause cracks in the joint layer due to thermal fatigue degradation. When the cracks extend and the extension lengths of the cracks increase, the thermal resistance increases and the temperature of heat generation during the energization rises. Thus, the semiconductor device may be led to the failure.

Regarding the failure mode caused by the cracks in the joint layer, the sintered metal, having 3 to 4 times higher strength than the solder materials, has been expected to prevent cracking and contribute to high temperature operation and improvement of reliability. However, it has been found that in the actual energization cycle, the cracks may not be generated in the sintered metal layer, but may be likely generated in the aluminum (Al) alloy layer of the electrode of the semiconductor chip. In the extending process of cracks generated in the electrode layer of the semiconductor element, the circuit may be broken by the semiconductor chip, resulting in an early failure.

Solutions to the occurrence of the cracks in the electrode layer of the semiconductor element are being studied. For example, JP 2010-245227 A describes that the recess is formed in the wiring layer of the insulated circuit board to concentrate the stress in the region of the joint layer in contact with the recess, so as to preferentially generate the cracks in the region in contact with the recess, and to prevent crack generation in the region of the joint layer where the joint layer is not in contact with the recess. Further, J P 2010-251457 A and WO 2017/002793 propose that the Al metal layer having a yield stress lower than that of the joint layer is used as the wiring layer of the insulated circuit board, and thus, the cracks are generated and extended in the wiring layer to improve the reliability of the joint layer. However, the Al alloy used for the electrode layer of the semiconductor chip and the Al metal of the wiring layer have comparable strength, and thus, it is difficult to control which layer the cracks occur. In addition, as the cracks occur and extend, the thermal resistance of the joint layer may increase, and the heat dissipation properties of the semiconductor chip may deteriorate. U.S. Pat. No. 8,987,879 describes that a plurality of protrusions are provided in the contact area of the contact clip connected to the lead frame, and the contact area is attached to the semiconductor element by using a solder member. However, U.S. Pat. No. 8,987,879 has no description about deterioration of the semiconductor chip due to the cracks. U.S. Pat. No. 9,929,111 describes the layer structure including two layers having different porosities. JP 2013-258122 A describes the adhesive containing silver particles of 90 mass % or more, and zinc particles of 0.01 mass % or more and 0.6 mass % or less.

SUMMARY OF THE INVENTION

An aspect of the present invention inheres in a semiconductor device, including: (a) a first semiconductor chip having a metal layer on a top surface; (b) a first wiring member arranged to face the metal layer; (c) a sintered-metal layer arranged between the metal layer and the first wiring member, having a first region and a plurality of second regions provided inside the first region, the second regions having lower tensile strength than the first region; and (d) a metallic member arranged inside the sintered-metal layer, wherein the second regions of the sintered-metal layer have lower tensile strength than the metal layer of the first semiconductor chip.

Another aspect of the present invention inheres in a method for manufacturing a semiconductor device, including: (a) joining a first semiconductor chip on a wiring layer arranged on an upper surface of an insulated circuit board; (b) stacking a first sintered-metal layer by drying a metal sintering paste applied to an upper surface of the first semiconductor chip; (c) arranging a first metal plate on the first sintered-metal layer so that the lower surface of the first metal plate is in contact with the first sintered-metal layer, the first metal plate having a plurality of first groove portions on a lower surface and a plurality of second groove portions on an upper surface; (d) stacking a second sintered-metal layer by drying a metal sintering paste applied to the upper surface of the first metal plate; (e) arranging a first wiring member on the second sintered-metal layer; and (f) pressurizing and heating the first sintered-metal layer and the second sintered-metal layer, so that the first sintered-metal layer is joined to the lower surface of the first metal plate and the first semiconductor chip so that the first sintered-metal layer fills in the first groove portions, and the second sintered-metal layer is joined to the upper surface of the first metal plate and the first wiring member so that the second sintered-metal layer fills in the second groove portions.

BRIEF DESCRIPTION OF THE DRAWINGS

FIG. 11 is an SEM image of a cross-sectional structure when pressurizing the sintered metal layer at 30 MPa;

FIG. 12 is an SEM image of a cross-sectional structure when pressurizing the sintered metal layer at 50 MPa;

FIG. 19 is a table illustrating the tensile strength characteristics of the Al metal layer and the Al alloy layer used for electrodes of the semiconductor element of the semiconductor device according to the first embodiment;

FIG. 20 is a schematic cross-sectional view illustrating another example of a through hole of a metal plate according to the first embodiment;

FIG. 21 is a schematic cross-sectional view illustrating still another example of a through hole of the metal plate according to the first embodiment;

DETAILED DESCRIPTION

Figure 1:
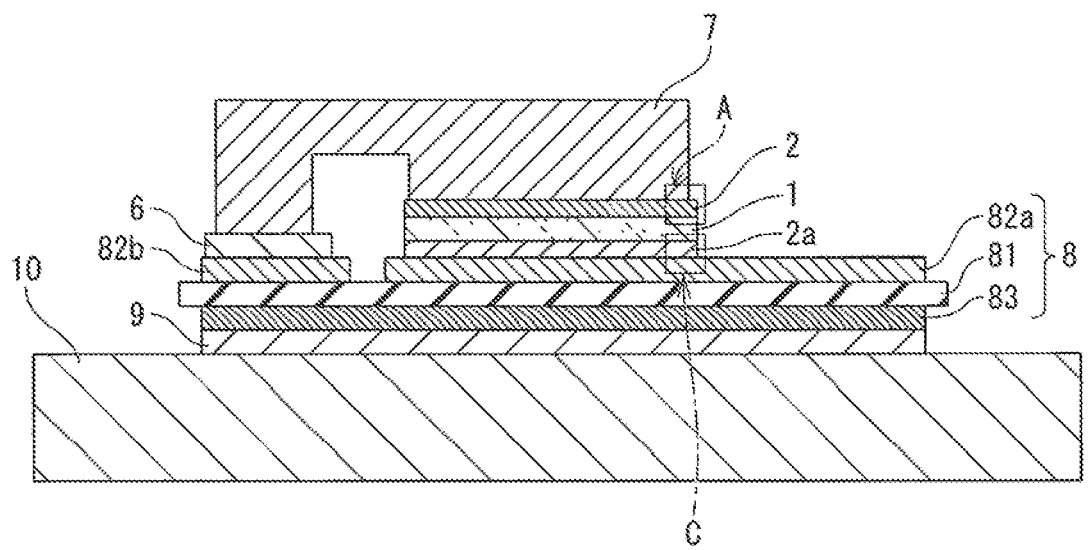
FIG. 1 is a schematic cross-sectional view illustrating an example of a structure of a semiconductor device according to a first embodiment of the present invention.

Hereinafter, first and second embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the following descriptions, the terms relating to directions, such as "left and right" and "top and bottom" are merely defined for illustration purposes, and thus, such definitions do not limit the technical idea of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top". Similarly, if the paper plane is rotated by 180 degrees, the inverted terms are defined for the relationship between "front" and "back".

First Embodiment

A semiconductor device according to the present invention encompasses a first semiconductor chip having a metal layer on a top surface, a first wiring member arranged to face the metal layer, a sintered metal layer arranged between the metal layer and the first wiring member, having a first region and a plurality of second regions which are provided within the first region and have a lower tensile strength than the first region, and a metallic member arranged inside the sintered metal layer. The second regions of the sintered metal layer have lower tensile strength than the metal layer of the first semiconductor chip. As illustrated in FIG. 1, the semiconductor device according to a first embodiment of the present invention includes a semiconductor chip (a first semiconductor chip) 1, joint portions 2, 2a, an insulated circuit board 8, and a wiring member (a first wiring member) 7. The insulated circuit board 8 has an insulating plate 81, conductor layers (wiring layers) 82a and 82b delineated on an upper surface of the insulating plate 81, and a conductor layer (a heat dissipation layer) 83 provided on a lower surface of the insulating plate 81. The upper surface of the semiconductor chip 1 is electrically connected to an end of the wiring member 7 via the joint portion 2. The lower surface of the semiconductor chip 1 is electrically connected to the conductor layer 82a of the insulated circuit board 8 via the joint portion 2a. The other end of the wiring member 7 is electrically connected to the conductor layer 82b of the insulated circuit board 8 via a joint portion 6. The conductor layer 83 of the insulated circuit board 8 is connected to a heat dissipation base 10 via a joint portion 9.

The power semiconductor element implementing the semiconductor chip 1 includes a three-terminal element, such as an IGBT or MOSFET, a two-terminal element, such as a free wheel diode (FWD) and a Schottky barrier diode (SBD). For the wiring member 7, a lead frame, a metal plate, a metal foil or the like, made of copper (Cu), aluminum (Al) and the like having a plating layer, such as a silver (Ag) layer or a gold (Au) layer, on the surface may be used. The insulated circuit board 8 is, for example, a direct copper bonding (DCB) substrate in which copper is eutectically bonded to the surface of a ceramic substrate, and an active metal brazing (AMB) substrate in which a metal is disposed on the surface of a ceramic substrate by an AMB method, and the like may be adopted. For a material of the ceramic substrate, such as silicon nitride ($Si_3N_4$), aluminum nitride (AlN), alumina ($Al_2O_3$) and the like may be adopted. In addition, as will be described later, it is desirable to provide a plating layer made of Ag, Au and the like, on the surface of the conductor layers 82a, 82b, 83 of the insulated circuit board 8 in consideration of joining with Ag nanoparticles or the like.

Figure 2:
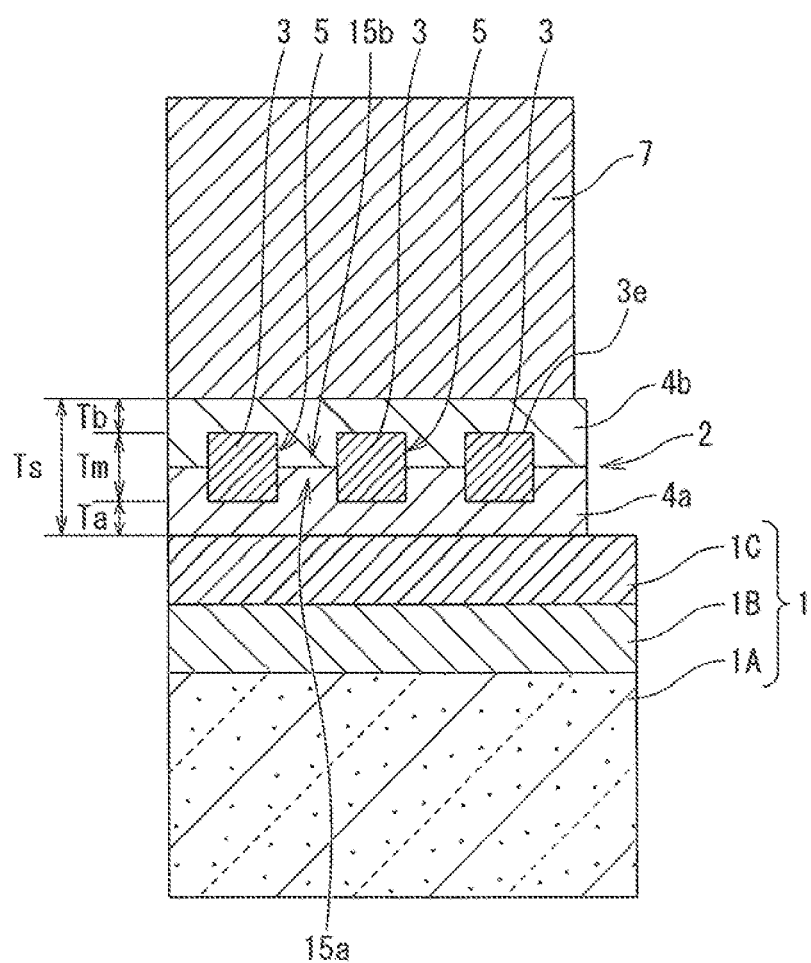
FIG. 2 is an enlarged view of part A in FIG. 1.
Figure 3:
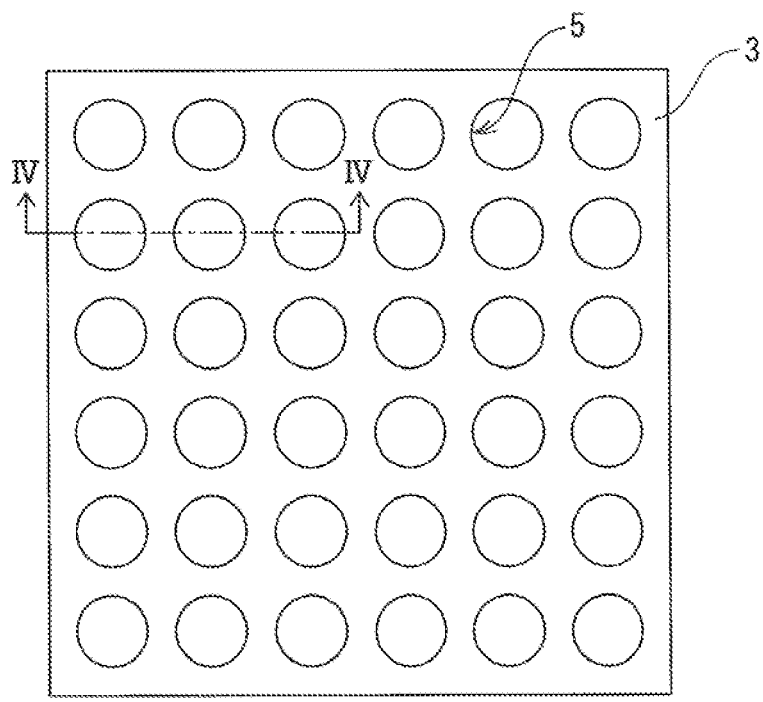
FIG. 3 is a schematic plan view illustrating an example of a metal plate according to the first embodiment.
Figure 4:
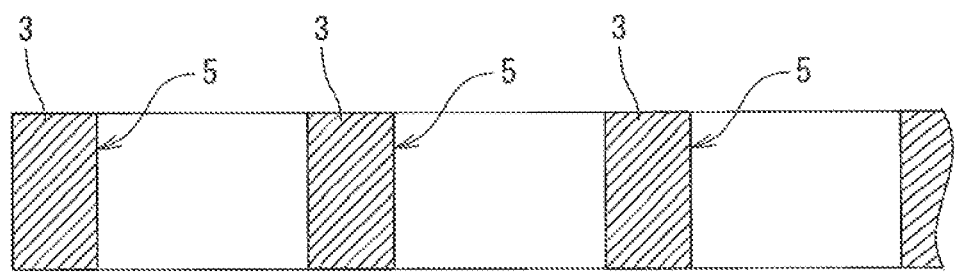
FIG. 4 is a cross-sectional view taken along a line IV-IV in FIG. 3.

FIG. 2 is an enlarged view of the part A in FIG. 1, that is, a joining part between the semiconductor chip 1 and the wiring member 7. As illustrated in FIG. 2, the semiconductor chip 1 includes a semiconductor layer 1A such as a SiC layer, and an electrode layer (1B, 1C), that is a metal layer (1B, 1C). The electrode layer (1B, 1C) has an electrode metal layer 1B made of Al or Al alloy, and an outer plated metal layer 1C made of silver (Ag) or gold (Au). The joint portion 2 includes a sintered metal layer (a first sintered metal layer) 4a arranged on the outer plated metal layer 1C, a sintered metal layer (a second sintered metal layer) 4b arranged on the first sintered metal layer 4a and under the wiring member 7, and a metal plate 3 having a plurality of through holes 5, arranged between the sintered metal layer 4a and the sintered metal layer 4b. In the through holes 5, each portion filled with the sintered metal layer 4a is defined as a first groove portion 15a, and each portion filled with the sintered metal layer 4b is defined as the second groove portion 15b. As illustrated in FIG. 3, the through holes 5 having circular shapes are arranged in a matrix on the metal plate 3 in a plan view. As illustrated in FIG. 4, the through holes 5 has the same diameter on upper and lower surfaces of the metal plate 3. The arrangement of the through holes 5 is not limited to the matrix, and may be a striped arrangement or a random arrangement. Further, each shape of the through holes 5 is not limited to the circular shape, and may be an elliptical shape, a rectangular shape, a polygonal shape, or the like.

The sintered metal layer 4a has a plurality of regions having different tensile strengths. Also, the sintered metal layer 4b has a plurality of regions having different tensile strengths. The metal plate 3, that is the metallic member or the first metal plate, is arranged between regions having the higher tensile strength in the sintered metal layer 4a and regions having the higher tensile strength in the sintered metal layer 4b.

A sintered metal layer (4a, 4b) is implemented by the sintered metal layer 4a arranged between the metal material 3 and the semiconductor chip 1 and the sintered metal layer 4b arranged between the metal material 3 and the wiring member 7. The metallic member 3 (first metal plate) has the first groove portions 15a on the lower surface, the second groove portions 15b on the upper surface, and a plane portion 3e on each of the lower and upper surfaces where the first groove portion 15a and the second groove portion 15b are not provided.

Figure 5:
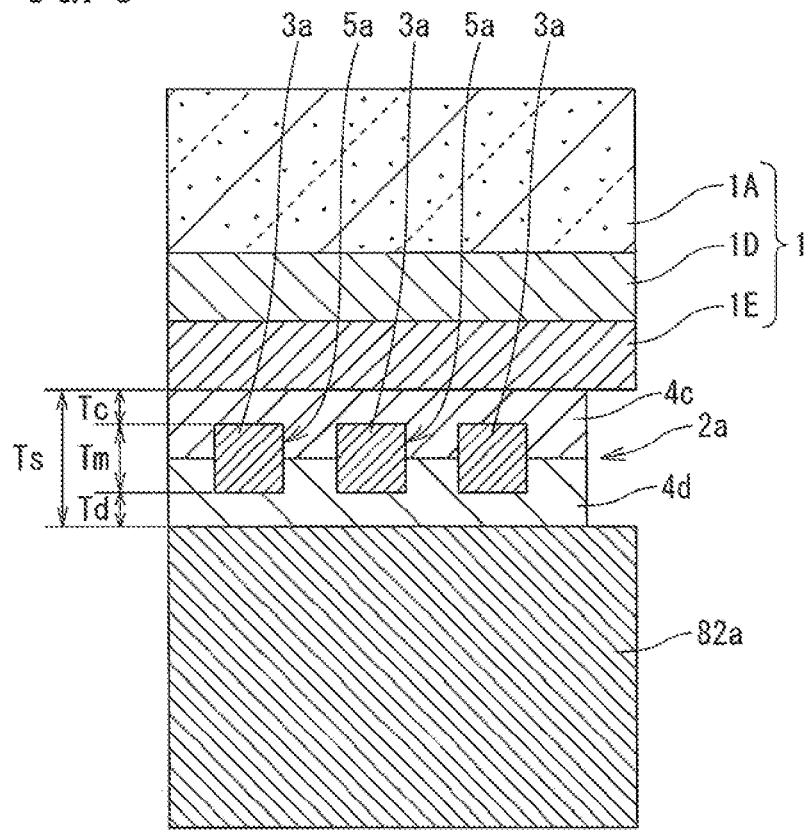
FIG. 5 is an enlarged view of part C in FIG. 1.

FIG. 5 is an enlarged view of the part C in FIG. 1, that is, a joining part between the semiconductor chip 1 and the insulated circuit board 8. As illustrated in FIG. 5, the semiconductor chip 1 includes the semiconductor layer 1A such as the SiC layer, and an electrode layer (1D, 1E), that is a metal layer (1D, 1E). The electrode layer (1D, 1E) has an electrode metal layer 1D made of Al or Al alloy, and an outer plated metal layer 1E made of silver (Ag) or gold (Au). The joint portion 2a includes a sintered metal layer 4c arranged below the outer plated metal layer 1E, a sintered metal layer 4d arranged on the conductor layer 82a of the insulating circuit substrate 8 and below the sintered metal layer 4c, and a metal plate 3a having a plurality of through holes 5a, arranged between the sintered metal layers 4c and 4d. Similarly to the metal plate 3 illustrated in FIGS. 3 and 4, the through holes 5a having circular shapes are arranged in a matrix on the metal plate 3a in a plan view. Each shape of the through holes 5a is not limited to the circular shape, and may be an elliptical shape, a rectangular shape, a polygonal shape, or the like. Further, the arrangement of the through holes 5a is not limited to the matrix, and may be a zigzag arrangement, a striped arrangement, or a random arrangement.

Nanometer-scale Ag nanoparticles may be used for a material of the sintered metal layers 4a, 4b, 4c, 4d. Alternatively, the material of the sintered metal layers 4a, 4b, 4c, 4d may be a composite material containing a micrometer-scale Ag powder in the Ag nanoparticles. For a material of the metal plate 3, a metal, such as Ag or Au, may be desirable in consideration of joining with the sintered metal layers 4e, 4f. Further, the metal plate 3 may be a metal plate made of copper (Cu), Al, Al alloy or the like, in which a surface is Ag-plated or Au-plated. It is desirable to use sintered metal for the joint portions 6, 9 illustrated in FIG. 1. However, since the joint portions 6, 9 are separated from the semiconductor chip 1 which is the heat source, a commonly-used joint member such as solder may be used.

Figure 6:
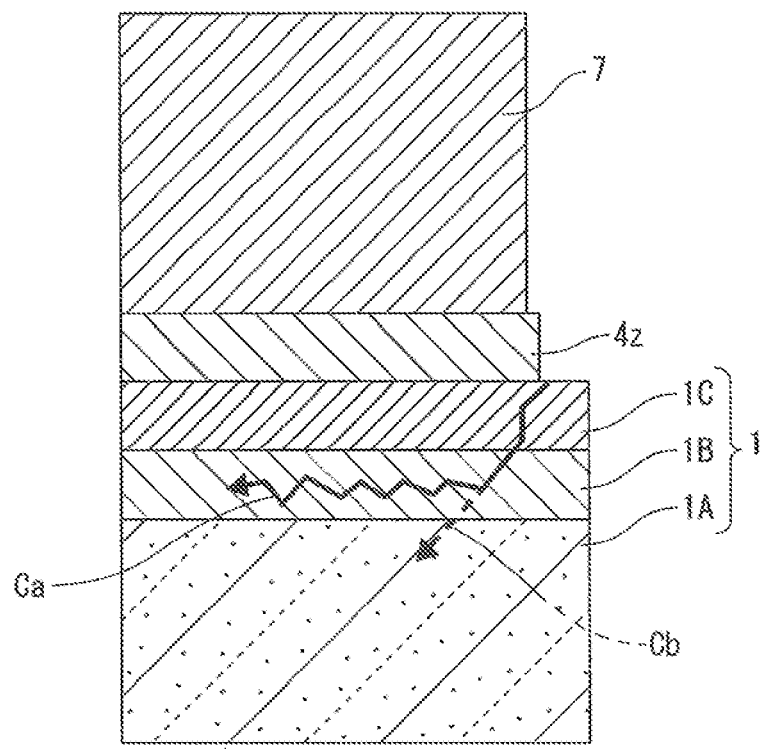
FIG. 6 is a cross-sectional view illustrating an example of crack occurrence in a conventional semiconductor device.

The sintered metal has a tensile strength (hereinafter, also simply referred to as a strength), for example, a yield stress represented by 0.2% proof stress (hereinafter, also simply referred to as a yield stress) by three to four times as much as a conventional solder joint material. Further, the yield stress may be by about five times as much as Al or Al alloy which is an electrode material of a semiconductor element. For example, as illustrated in FIG. 6, similarly to the conventional semiconductor device, the semiconductor chip 1 and the wiring member 7 such as a lead frame may be joined with a sintered metal layer 4z made of Ag nanoparticles. In the semiconductor device joined with the sintered metal layer 4z having higher strength, the entire wiring member 7 repeatedly undergoes thermal expansion and contraction in an energization cycle test, so that the sintered metal layer 4z as a joint portion, is repeatedly strained. Since the sintered metal layer 4z as the joint portion has sufficient strength against the stress repeatedly applied to the joint portion, the joint portion is prone to cracking to easily extend a crack Ca to the electrode metal layer 1B made of Al or Al alloy, which has lower strength. Also, possibly a generated crack Cb may extend to the semiconductor layer 1A of the semiconductor chip 1. Thus, the electrodes of the semiconductor chip 1 may deteriorate, resulting in an early failure of the semiconductor device.

In the semiconductor device according to the first embodiment, the strengths of the sintered metal layers 4a, 4b are controlled by using the metal plate 3 having the through holes 5, between the sintered metal layers 4a and 4b. First, a relationship of the cross-sectional structure of the joint portion with respect to applied pressure to the sintered metal will be described with reference to FIGS. 7 to 12. A nano-Ag sintering paste in which Ag nanoparticles are dispersed in a solvent are printed on a flat underlying layer such as a metal layer by a printing method. After printing, the base layer is dried to remove the solvent. The dried sintered metal layer made of the Ag nanoparticles after drying the solvent has a thickness of about ½ the printed layer of the Ag nanoparticles. Here, a thickness of the dried sintered metal layer after drying the solvent is defined as a "supply-thickness". Incidentally, a sintered metal sheet or a sintered metal preform, which are made of Ag nanoparticles, may be adopted. In such case, drying procedure for solvent may be omitted. The dried sintered metal layer is pressurized with a pressing tool while being heated at a temperature in a range of 200° C. or higher and 300° C. or lower, for example, 250° C. to be joined to the underlying layer. Each cross-sectional structure of the laminated sintered metal layers changing a pressure in a range of 0.25 MPa to 50 MPa has been observed by a scanning electron microscope (SEM). Here, a thickness of the laminated sintered metal layer after pressurization is defined as a "laminate-thickness".

Figure 7:
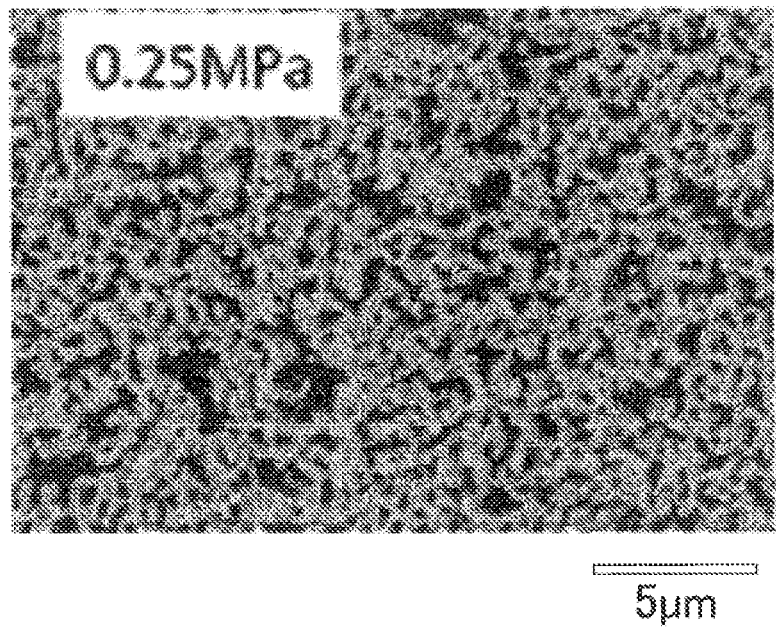
FIG. 7 is a SEM image of a cross-sectional structure when pressurizing the sintered metal layer at 0.25 MPa.
Figure 8:
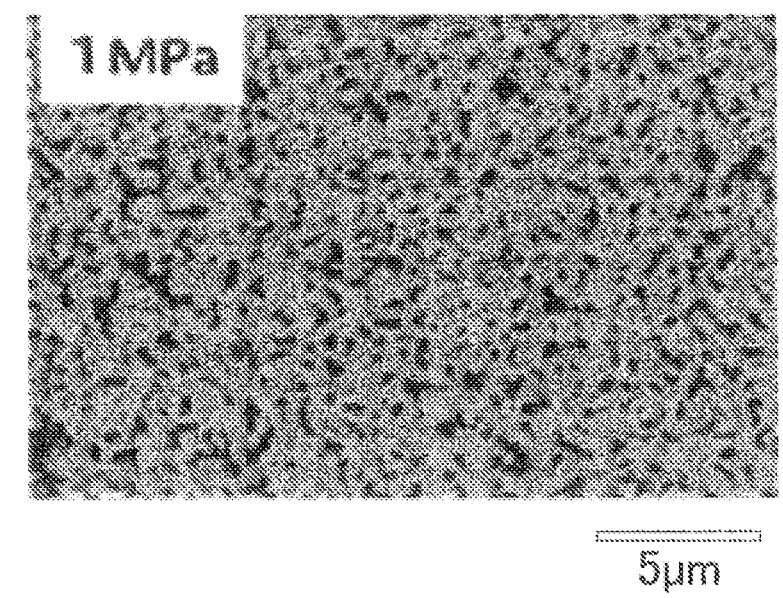
FIG. 8 is an SEM image of a cross-sectional structure when pressurizing the sintered metal layer at 1 MPa.
Figure 9:
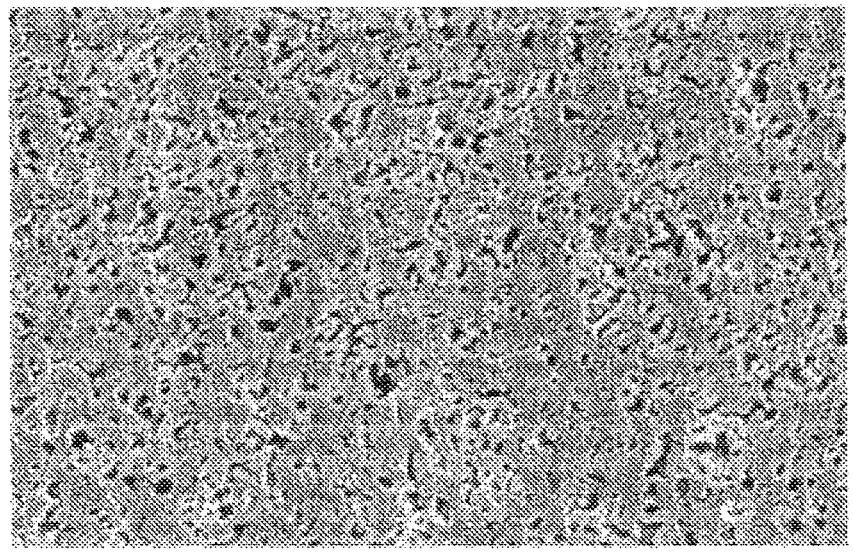
FIG. 9 is an SEM image of a cross-sectional structure when pressurizing the sintered metal layer at 5 MPa.
Figure 10:
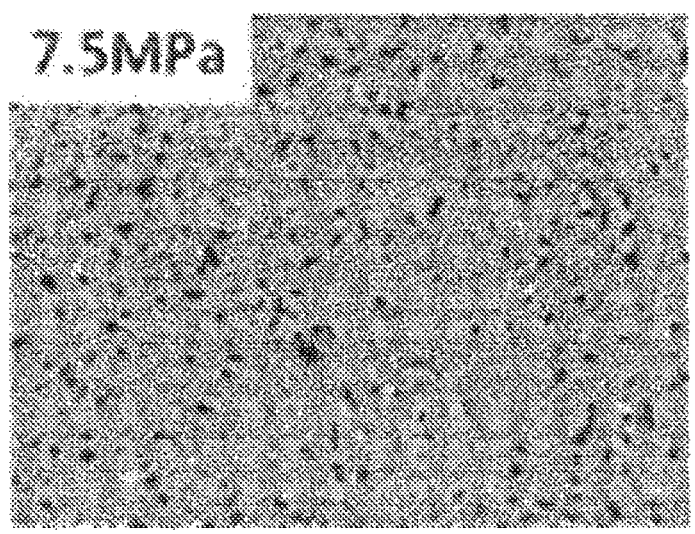
FIG. 10 is an SEM image of a cross-sectional structure when pressurizing the sintered metal layer at 7.5 MPa.

FIGS. 7 to 12 are scanning electron microscope (SEM) images of cross-sectional structures of the sintered metal layers laminated by changing pressures in a range of 0.25 MPa to 50 MPa. In each of the SEM images illustrated in FIGS. 7 to 12, a bright portion corresponds to sintered metal and a dark portion corresponds to pores. At a low pressure of 1 MPa or less, as illustrated in FIGS. 7 and 8, dimensions of the voids are large and a sintering density of the sintered metal is low. When the pressure is increased in a range of 5 MPa to 7.5 MPa, dimensions of the voids decreases sharply as illustrated in FIGS. 9 and 10. Further, when the pressure is increased in range of 30 MPa to 50 MPa, as illustrated in FIGS. 11 and 12, dimensions of the voids becomes extremely small and the sintered metal layer is densified.

Figure 13:
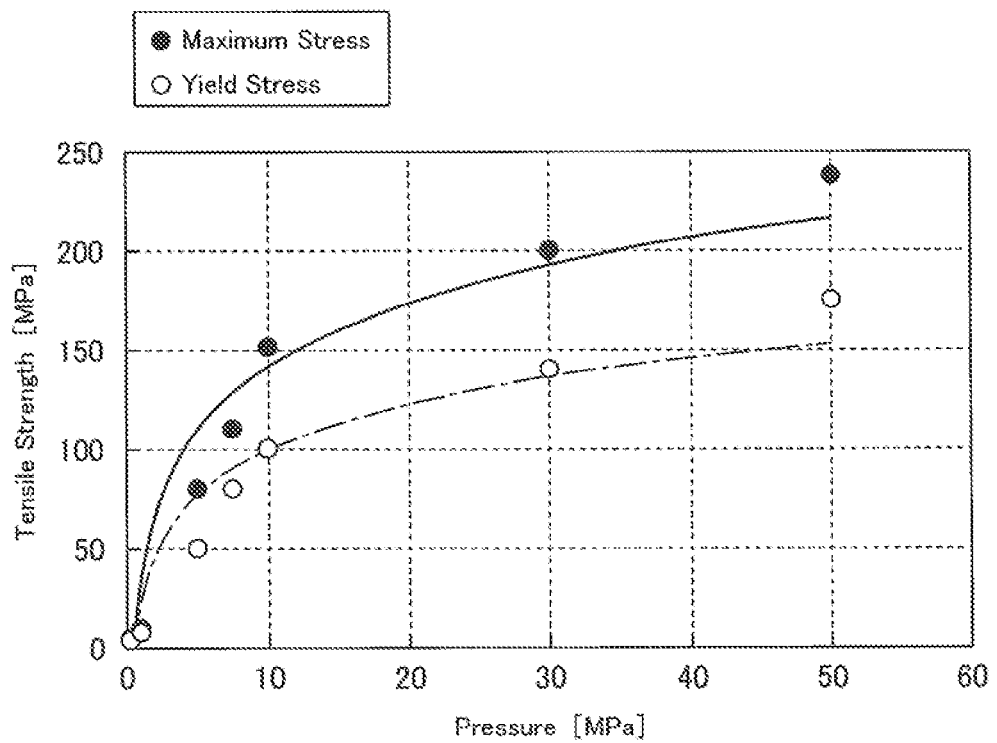
FIG. 13 is a diagram illustrating a relationship of the tensile strength to the pressure applied to the sintered metal layer.
Figure 14:
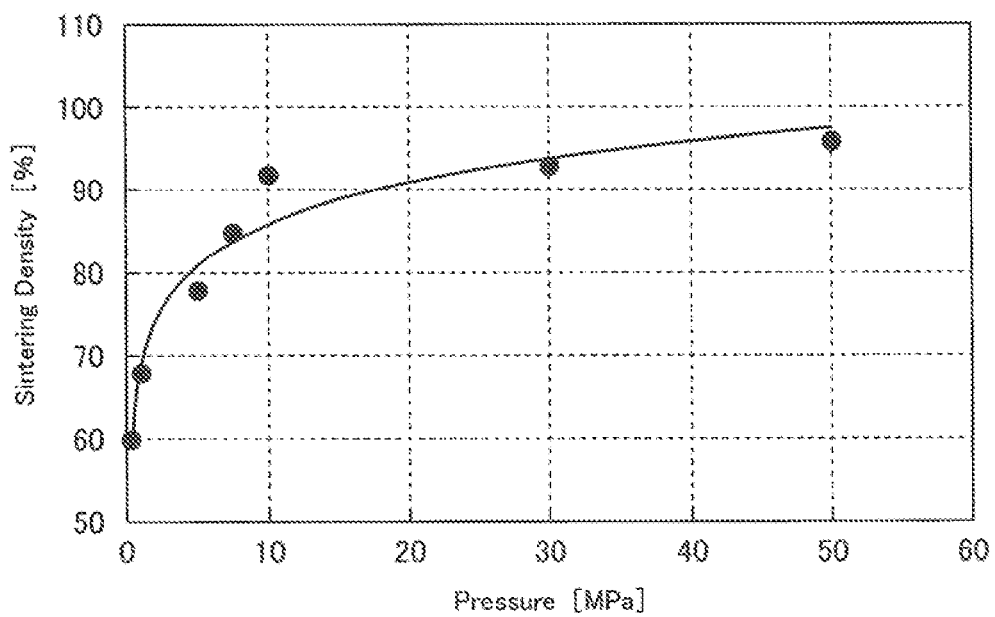
FIG. 14 is a diagram illustrating a relationship of the sintering density to the pressure applied to the sintered metal layer.

FIGS. 13 and 14 illustrate relationships of the tensile strength and the sintering density to the pressure applied to the sintered metal layer when changing the pressure in a range of 0.25 MPa to 50 MPa. As illustrated in FIG. 13, the yield stress represented by 0.2% proof stress and the maximum stress increase sharply as the pressures increase from about 0 to about 10 MPa, and gradually increase as the pressures increase from about 10 MPa to about 50 MPa. As illustrated in FIG. 14, the sintering density also increases sharply as the pressure increases from about 0 to about 10 MPa, and gradually increases as the pressure increase from about 10 MPa to about 50 MPa. As observed in the SEM images of FIGS. 7 to 12, by increasing the pressurization, the sintered metal powders of the sintered metal layer can be densely packed with each other to increase the sintering density and to increase the tensile strength of the sintered metal layer.

Figure 15:
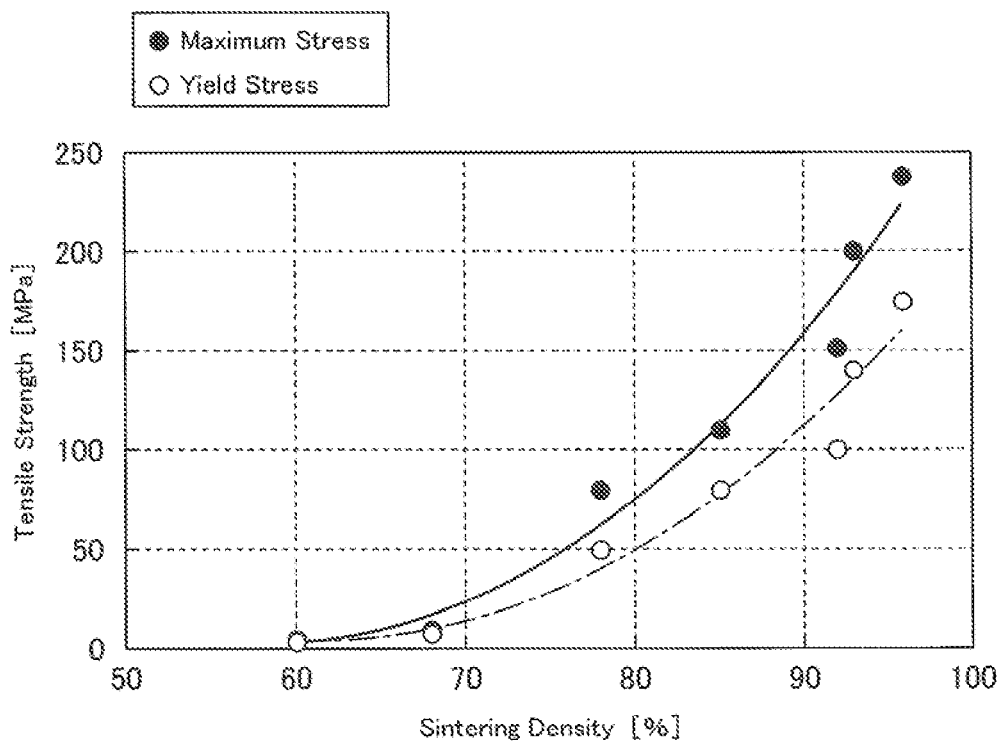
FIG. 15 is a diagram illustrating a relationship of the tensile strength to the sintering density of the sintered metal layer.
Figure 16:
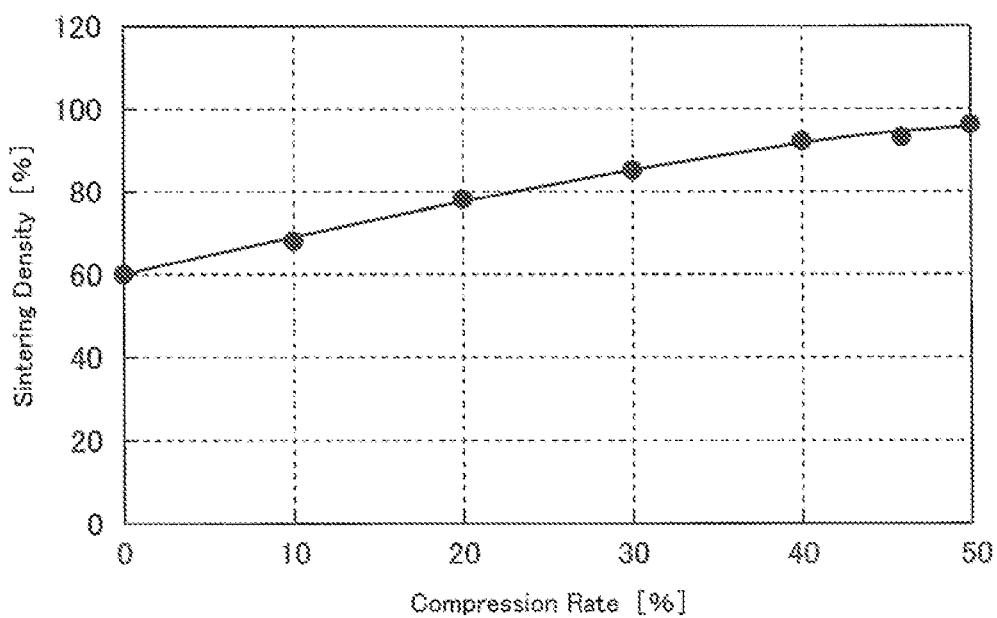
FIG. 16 is a diagram illustrating a relationship of the sintering density to the compression rate of the sintered metal layer.
Figure 17:
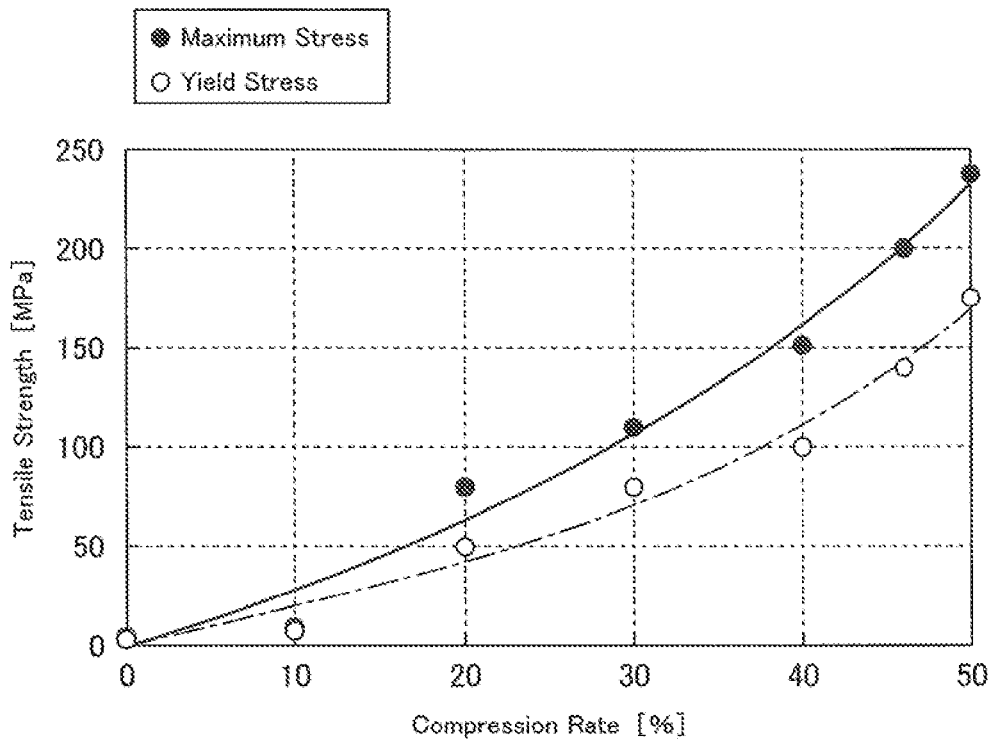
FIG. 17 is a diagram illustrating a relationship of the tensile strength to the compression rate of the sintered metal layer.
Figure 18:
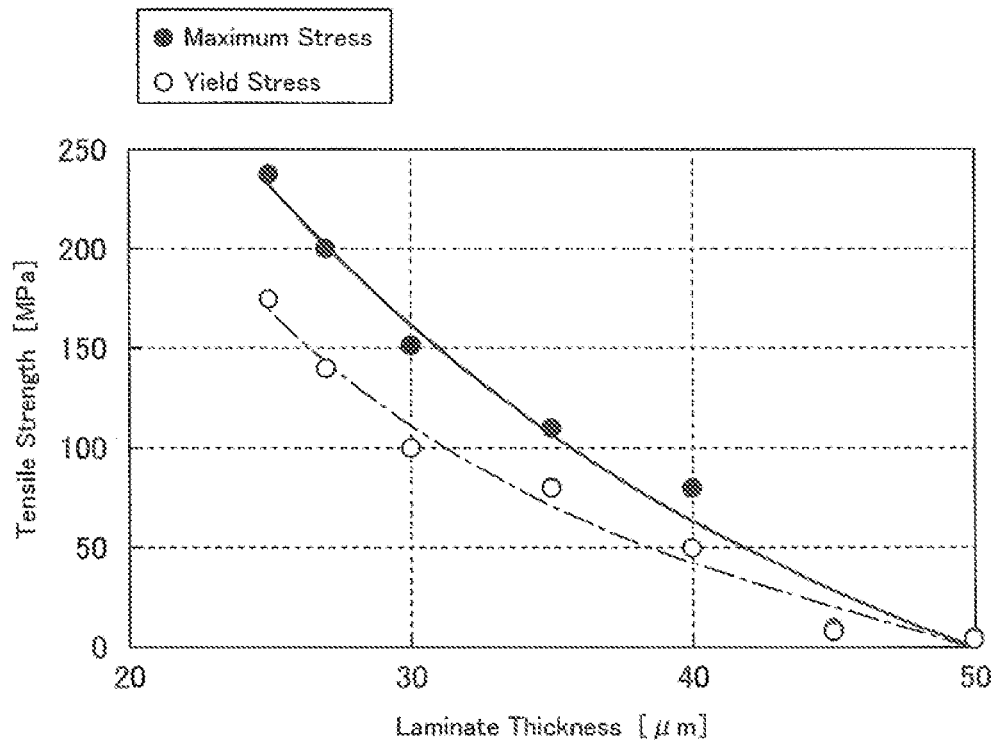
FIG. 18 is a diagram illustrating a relationship of the tensile strength to the thickness of the sintered metal layer.

FIG. 15 illustrates a relationship between the sintering density of the sintered metal layer and the tensile strength. As illustrated in FIG. 15, the yield stress of the sintered metal layer depends on the sintering density. Here, percent of variation in the laminate-thickness in a thickness direction with respect to the supply-thickness of the sintered metal layer is defined as a "compression rate". Specifically, considering that the compression of the sintered metal layer by pressurization occurs substantially in a pressurizing direction, that is, in the thickness direction, the "compression rate" can be obtained from variation in the sintering density. FIG. 16 illustrates a relationship between the compression rate and the sintering density. As illustrated in FIG. 16, when the compression rate is around 0%, the sintered metal layer contains the voids of about 60%. Also, when the compression rate is around 50%, the voids may be almost eliminated in the sintered metal layer. FIG. 17 illustrates a relationship between the compression rate and the tensile strength. As the compression rate of the sintered metal layer increases, the tensile strength increases. Further, considering that the compression of the sintered metal layer occurs substantially one-dimensionally in the pressurizing direction, the laminate-thickness of the sintered metal layer can be obtained by using the compression rate or the sintering density. FIG. 18 illustrates a relationship between the laminate-thickness and the tensile strength. As illustrated in FIG. 18, the tensile strength decreases as the laminate-thickness of the sintered metal layer increases. As described above, a strength corresponding to the yield stress of the sintered metal layer can be controlled by a pressure applied by a press machine. Alternatively, a strength of the yield stress of the sintered metal layer can also be detected by the sintering density, the compression rate and the laminate-thickckness of the sintered metal layer.

In the first embodiment, the stress generated during the energization of the semiconductor device is dispersed in the joint portion 2, by controlling the sintering densities of the sintered metal layers 4a, 4b so as to have the same or lower strength than the electrode metal layer 1B of the semiconductor chip 1. In order to control the yield stress of the sintered metal layers 4a, 4b of the joint portion 2, as illustrated in FIGS. 1 to 4, the metal plate 3 having the through holes 5 is arranged between the sintered metal layer 4a and the sintered metal layer 4b. Table in FIG. 19 illustrates results of tensile strength tests on an Al metal having a purity of 99.99% (4N) and an Al alloy containing 1.0% Si (Al-1.0% Si alloy) used for the electrode metal layer 1B, each using a test piece with a diameter of about 6 mm and a gauge length of about 30 mm. As illustrated in FIG. 19, the yield stress is about 27 MPa for the Al metal and about 35 MPa for the Al-1.0% Si alloy. Therefore, in order to prevent the occurrence of cracks in the electrode metal layer 1B, the strength of the sintered metal layers 4a, 4b may be controlled to a strength equal to or less than the tensile strength of the Al metal or the Al alloy, for example, in a range of about 20 MPa to about 40 MPa. As illustrated in FIG. 15, in order to control the strengths of the sintered metal layers 4a, 4b in the range of about 20 MPa to about 40 MPa, the sintering densities may be in a range of about 72% or more and about 78% or less. Alternatively, as illustrated in FIG. 17, in order to control the strength of the sintered metal layers 4a, 4b in the range of about 20 MPa to about 40 MPa, the compression rates may be in a range of about 10% or more and about 20% or less.

Further, a thickness Tm of the metal plate 3 is preferably less than 50% of the supply-thickness or less than 63% of the laminate-thickness. When the thickness Tm of the metal plate 3 is 50% or more of the supply-thickness, each compression rate of the sintered metal layers 4a, 4b in the respective upper and lower regions of the metal plate 3 may increase, and thus, the pressurization to the regions of the through holes 5 may be insufficient. In such case, since contact areas between the sintered metal layer 4a and the semiconductor chip 1, and between the sintered metal layer 4b and the insulated circuit board 8 may be reduced, the joint strength may be decreased and the thermal resistance may be increased. Further, in case any metal plate is not used, a conventional method for heating and pressurizing a sintered metal layer has to be adopted. For example, when a plurality of semiconductor chips having different thicknesses are used, or when a semiconductor chip having warpage or inclination is used, it is difficult to control the sintering density because the pressurization may be excessive or insufficient by the position. Therefore, the thickness Tm of the metal plate 3 is required to some extent.

In the first embodiment, in joining the semiconductor chip 1 and the wiring member 7, the strengths of the sintered metal layers 4a, 4b in the regions of the through holes 5 illustrated in FIG. 2 are controlled in the range of about 20 MPa to about 40 MPa, for example, about 35 MPa. In such case, the sintering density corresponds to about 76% and the compression rate corresponds to about 18%. For example, when each supply-thickness of the sintered metal layers 4a, 4b in the regions of the through holes 5 is about 100 μm, the laminate-thickness Ts illustrated in FIG. 2 is about 82 μm, and thus, the amount of deformation due to compression is about 18 μm. In such case, the sintering densities of the sintered metal layers 4a, 4b in the respective upper and lower regions of the metal plate 3 are greater than about 76% and less than about 90%. The supply-thickness of the sintered metal layers 4a, 4b is preferably in a range of about 50 μm or more and about 1000 μm or less, and the laminate-thickness is in a range of about 41 μm or more and about 820 μm or less.

In the semiconductor device according to the first embodiment, as illustrated in FIG. 2, the metal plate 3 having the through holes 5 is arranged between the sintered metal layer 4a and the sintered metal layer 4b to disperce the stress generated during energization in the joint portion 2. The sintered metal layers 4a, 4b in the upper and lower regions of the metal plate 3 have higher strengths than in the regions of the through holes 5. The sintered metal layers 4a, 4b in the regions of the through holes 5 in which the strengths are lower, are localized surrounded by the sintered metal layers 4a, 4b in the upper and lower regions of the metal plate 3 in which the strengths are higher. Therefore, even if the cracks occur in the sintered metal layers 4a, 4b in the regions of the through holes 5, it is possible to prevent from extending to the entire sintered metal layers 4a, 4b including the upper and lower regions of the metal plate 3. As a result, deterioration of the semiconductor chip 1 can be prevented, and the reliability of the semiconductor device can be improved.

Further, a thickness Tb of the sintered metal layer 4b between the metal plate 3 and the wiring member 7 is desirably thicker than a thickness Ta of the sintered metal layer 4a between the metal plate 3 and the semiconductor chip 1. When the sintered metal layer 4b is thicker than the sintered metal layer 4a, the strength of the sintered metal layer 4b may be smaller than the sintered metal layer 4a. Thus, the cracks may occur in the sintered metal layer 4b between the wiring member 7 and the metal plate 3, and it is possible to prevent the cracks from extending toward the semiconductor chip 1.

In a planar pattern, an occupied area of the through holes 5 defined as a sum of surface areas of entire openings of the through holes 5 is desirably 25% or more and 75% or less with respect to a total surface area defined as a sum of a surface area of the metal plate 3 and the surface areas of the entire openings of the through holes 5. When the occupied area of the through holes 5 is less than 25%, the ratio of the portion having higher strength in the sintered metal layers 4a, 4b increases, and possibility of the crack-occurrence in the electrode metal layers 1B, 1D increases. When the occupied area of the through holes 5 exceeds 75%, the ratio of the portion having lower strength in the sintered metal layers 4a, 4b increases, and possibility of crack-occurrence in the sintered metal layers 4a, 4b increases. Further, as illustrated in FIG. 20, in order to lower the strength of the sintered metal layer 4b on the wiring member 7 as compared to the strength of the sintered metal layer 4a on the semiconductor chip 1, the occupied area of openings may be adjusted by using a metal plate 3b having a through hole 5b. In the through hole 5b, an opening size w1 of the first groove portion 55a on the semiconductor chip 1 is smaller than an opening size w2 of the second groove portion 55b on the wiring member 7. Therefore, the strength of the sintered metal layer 4b on the wiring member 7 may be smaller than that of the sintered metal layer 4a on the semiconductor chip 1. In addition, as illustrated in FIG. 21, a metal plate 3c having a through hole 5c may be used. The through hole 5c has an inclined side wall in which an opening size w2 on the wiring member 7 is larger than an opening size w1 on the semiconductor chip 1.

Similarly, in joining the semiconductor chip 1 and the wiring layer 82a of the insulated circuit board 8, the strengths of the sintered metal layers 4c, 4d in the regions of the through holes 5a illustrated in FIG. 5 are controlled in the range of 20 MPa or more and 40 MPa or less, for example, about 35 MPa. For example, assuming that each supply-thickness of the sintered metal layers 4c, 4d is about 100 μm, the laminate-thickness Ts illustrated in FIG. 5 is about 82 μm, that is, the amount of deformation due to compression is about 18 μm. In such case, the sintering density corresponds to about 76% and the compression rate corresponds to about 18%. Further, the thickness Tm of the metal plate 3a is preferably less than 50% of the supply-thickness.

Further, as illustrated in FIG. 5, a thickness Td of the sintered metal layer 4d between the metal plate 3a and the wiring layer 82a of the insulated circuit board 8 is desirably thicker than a thickness Tc of the sintered metal layer 4c between the metal plate 3a and the semiconductor chip 1. When the sintered metal layer 4d is thicker than the sintered metal layer 4c, the strength of the sintered metal layer 4d may be smaller than the strength of the sintered metal layer 4c. Thus, the cracks occur in the sintered metal layer 4d between the wiring layer 82a and the metal plate 3a, and it is possible to prevent the cracks from extending toward the semiconductor chip 1. Further, in order to lower the strength of the sintered metal layer 4d on the insulated circuit board 8 in comparison to the strength of the sintered metal layer 4c on the semiconductor chip 1, a metal plate having different opening sizes on respective sides of the semiconductor chip 1 and the insulated circuit board 8 as illustrated in FIGS. 20 and 21, may be used.

Next, a manufacturing method of the semiconductor device according to the first embodiment will be described with reference to FIGS. 1 and 2. First, a metal sintering paste in which Ag nanoparticles are dispersed in a solvent is applied to the upper surface of the electrode layers (1B, 1C) of the semiconductor chip 1 joined to the wiring layer 82a of the insulated circuit board 8 by a printing method, a dispensing method or the like. The applied metal sintering paste is dried in a temperature range of about 100° C. or higher and about 150° C. or lower in which sintering of the Ag nanoparticles does not occur, to remove the solvent, and thus, the sintered metal layer 4a is laminated. The metal plate 3 having a plurality of through holes 5 is arranged on the sintered metal layer 4a. The metal sintering paste in which the Ag nanoparticles are dispersed in the solvent is applied onto the metal plate 3 by a printing method, a dispensing method, or the like. The applied metal sintering paste is dried in a temperature range of about 100° C. or higher and about 150° C. or lower to remove the solvent, and thus, the sintered metal layer 4b is laminated. In such way, the joint portion 2 having the sintered metal layer 4a, the metal plate 3, and the sintered metal layer 4b is formed on the upper surface of the semiconductor chip 1. The sintered metal layers 4a, 4b are physically connected to each other in the through holes 5.

The wiring member 7 such as a lead frame is arranged on the joint portion 2, and the sintered metal layers 4a, 4b are pressurized while heating in a range of about 200° C. or higher and about 300° C. or lower, for example, at about 250° C. from above the wiring member 7 by a pressure molding apparatus such as a pressing machine. Pressurization is executed at a pressure in which the compression rate of the sintered metal layers 4a, 4b is in a range of about 10% or more and about 20% or less in the regions of the through holes 5. By the pressurization, the semiconductor chip 1 and the sintered metal layer 4a, and the sintered metal layer 4b and the wiring member 7 are joined, respectively. In the through holes 5, the sintered metal layers 4a, 4b are metallurgically connected, and the sintering densities of the sintered metal layers 4a, 4b are in a range of about 72% or more and about 78% or less. On the other hand, in the regions on the metal plate 3, the sintering densities of the sintered metal layers 4a, 4b are higher than the sintering densities of the sintered metal layers 4a, 4b in the regions of the through holes 5. Thus, the semiconductor device in which the semiconductor chip 1 is joined to the insulated circuit board 8 and the wiring member 7 by the sintered metal layers 4a, 4b is manufactured.

In the above description, the metal sintering paste is used for laminating the sintered metal layers 4a and 4b, but a sintered metal sheet or a sintered metal preform, which are made of Ag nanoparticles, may be adopted. Further, for the joint portion 2, a multilayer plate (a cladded material) in which sintered metal layers are previously arranged on front and back surfaces of a metal plate having through holes may be used.

Figure 22:
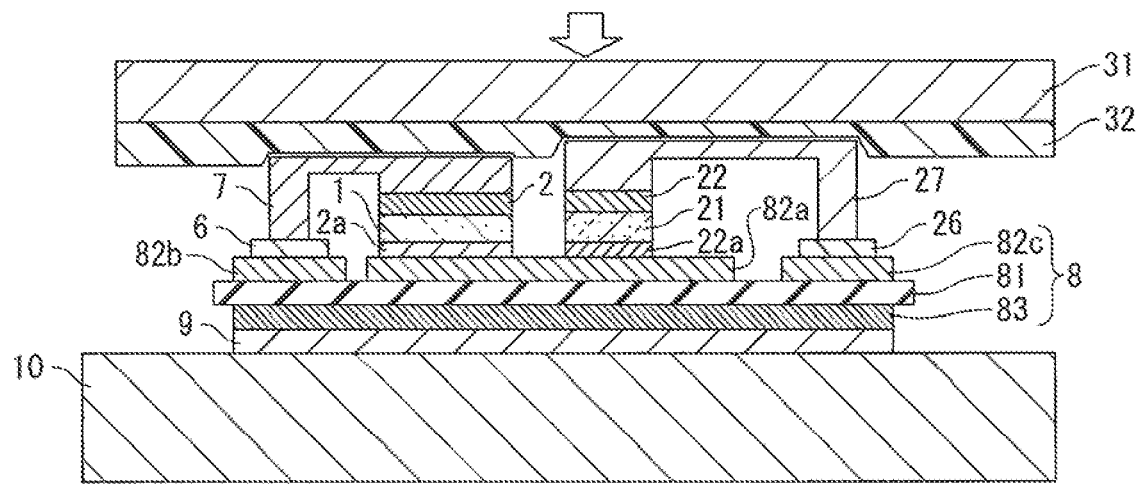
FIG. 22 is a schematic cross-sectional view illustrating an example of a pressurizing step in a manufacturing method for the semiconductor device according to the first embodiment.

As mentioned above, although the case of joining one semiconductor chip 1 has been described, a plurality of semiconductor chips may be adopted. When each thickness of the semiconductor chips is different, the difference in thickness may be adjusted by a buffer member such as heat-resistant rubber arranged between the semiconductor device and a press mold of the pressure molding apparatus. For example, as illustrated in FIG. 22, as the semiconductor device, a semiconductor chip (a first semiconductor chip) 1 such as an IGBT or MOSFET and a semiconductor chip (a second semiconductor chip) 21 such as FWD or SBD may be used. The semiconductor chip 1 is joined to the wiring layer 82a via the joint portion 2a. An end of the wiring member 7 is joined to the semiconductor chip 1 via the joint portion 2. The other end of the wiring member 7 is joined to the wiring layer 82b via the joint portion 6. Similarly, the semiconductor chip 21 is joined to the wiring layer 82a via the joint portion 22a. An end of the wiring member 27 is joined to the semiconductor chip 21 via the joining portion 22. The other end of the wiring member 27 is joined to wiring layer 82c via the joint portion 26. Each of the joint portions 22, 22a have a structure in which a metal plate having through holes is sandwiched between sintered metal layers, similarly to the joint portions 2, 2a illustrated in FIGS. 2 and 5. For example, when the semiconductor chip 21 is thicker than the semiconductor chip 1, a buffer member 32 is arranged on a pressurizing face of a press mold 31 such that a portion of the buffer member 32 in contact with the wiring member 27 to the semiconductor chip 21 is thinned less than another portion of the buffer member 32 in contact with the wiring member 7 to the semiconductor chip 1. Thus, it is possible to simultaneously pressurize to collectively join the plural semiconductor chips to the wiring members by using the press mold 31 of the pressure molding apparatus via the buffer member 32.

Figure 23:
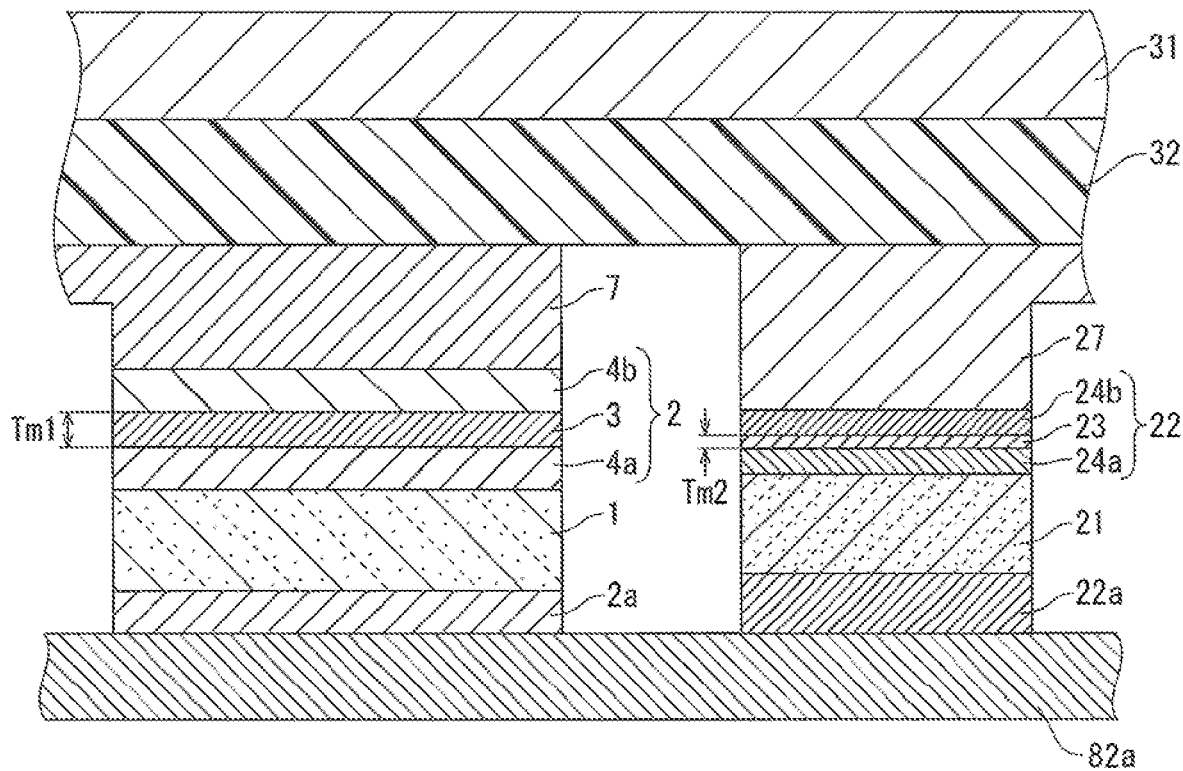
FIG. 23 is a schematic cross-sectional view illustrating another example of a pressurizing step in the manufacturing method for the semiconductor device according to the first embodiment.

Moreover, it is also possible to adjust the difference in the thicknesses of the semiconductor chips with the metal plate used for the joint. For example, as illustrated in FIG. 23, the joint portion 2 includes the sintered metal layer 4a, the sintered metal layer 4b, and the metal plate 3. The metal plate 3 is arranged between the sintered metal layer 4a and the sintered metal layer 4b, and has the through holes (not illustrated). The joint portion 22 includes a sintered metal layer 24a, a sintered metal layer 24b, and a metal plate 23. The metal plate 23 is arranged between the sintered metal layer 24a and the sintered metal layer 24b, and has a plurality of through holes (not illustrated). A thickness Tm2 of the metal plate 23 is made thinner than a thickness Tm1 of the metal plate 3, so that the upper surface of the wiring member 7 of the semiconductor chip 1 and the upper surface of the wiring member 27 of the semiconductor chip 21 are at the same level. As a result, as illustrated in FIG. 23, the buffer member 32 arranged on the pressurizing face of the press mold 31 can be in contact with the wiring members 7, 27 by a flat surface, and it is possible to simultaneously pressurize to collectively join the semiconductor chips 1, 21 to the wiring members 7, 27, respectively. In addition, the level of the upper surfaces of the wiring members 7, 27 may be adjusted by the thickness of the metal plate used for each of the joint portion 2a of the semiconductor chip 1 and the joint portion 22a of the semiconductor chip 21. Alternatively, the level of the upper surface of the wiring members 7, 27 may be adjusted by a sum of the thicknesses of the metal plates used in the joints 2, 2a and a sum of the thicknesses of the metal plates used in the joints 22, 22a.

Second Embodiment

Figure 24:
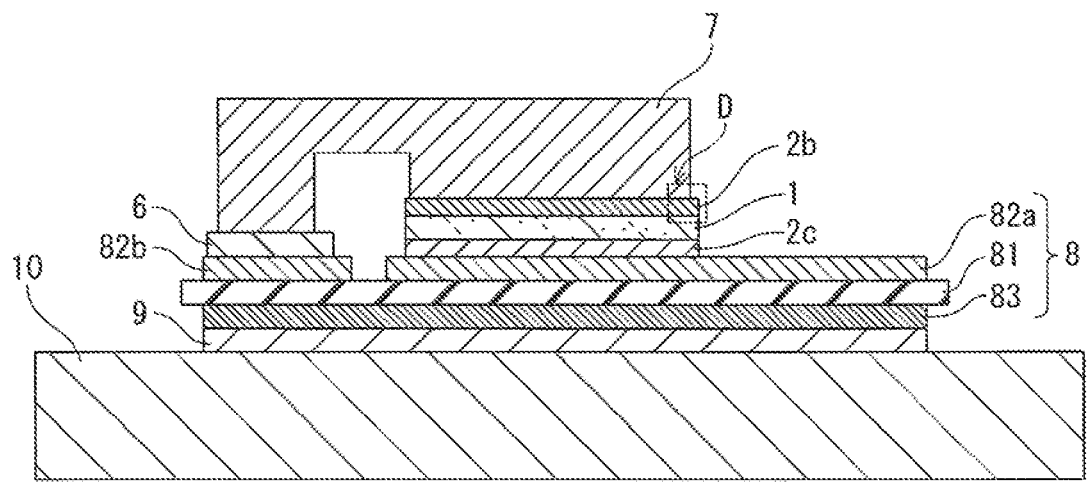
FIG. 24 is a schematic cross-sectional view illustrating an example of a structure of a semiconductor device according to a second embodiment.
Figure 25:
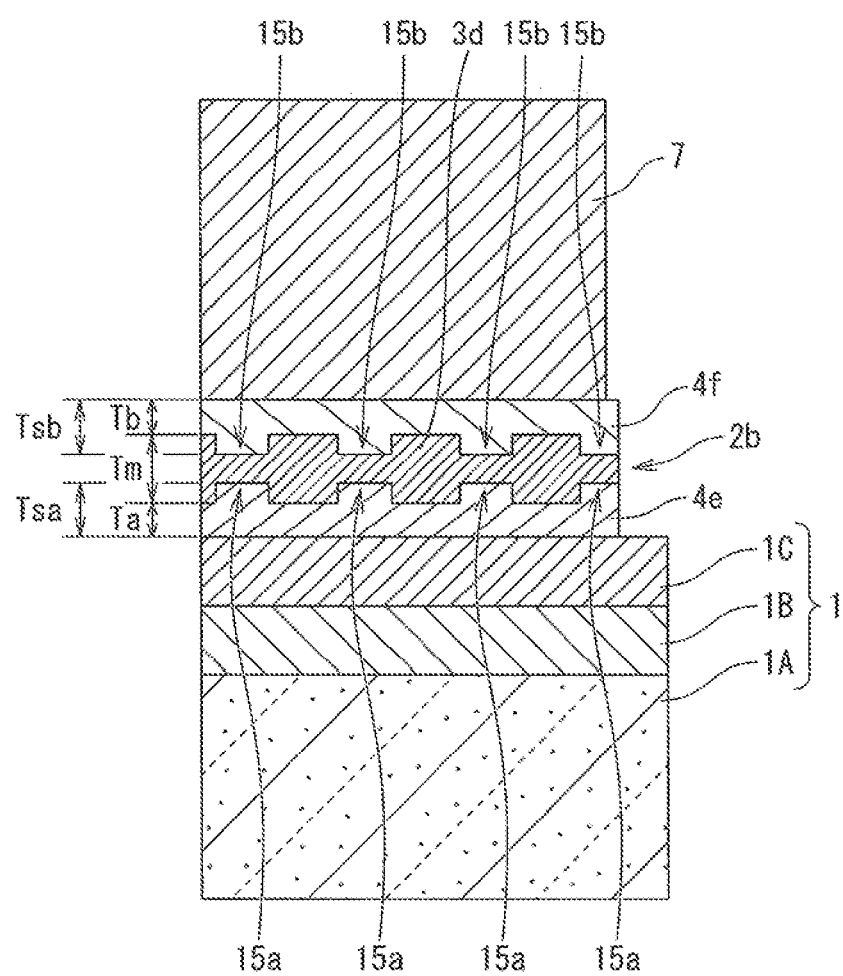
FIG. 25 is an enlarged view of part D in FIG. 24.

As illustrated in FIG. 24, a semiconductor device according to a second embodiment includes the semiconductor chip 1, a joint portion 2c to join the semiconductor chip 1 and the insulated circuit board 8, and a joint portion 2b to join the semiconductor chip 1 and the wiring member 7. FIG. 25 is an enlarged view of Part D in FIG. 24. As illustrated in FIG. 25, the joint portion 2b is arranged between the electrode layer (1B, 1C) and the wiring member 7. The joint portion 2b includes a sintered metal layer 4e arranged on the outer plated metal layer 1C, a sintered metal layer 4f arranged below the wiring member 7, and a metal plate 3d arranged between the sintered metal layers 4e, 4f. The metal plate 3d has a plurality of first groove portions 15a and a plurality of second groove portions 15b separately on a lower surface and an upper surface, respectively. The first groove portions 15a are provided on one side of the metal plate 3d facing the semiconductor chip 1. The second groove portions 15b are provided on another side of the metal plate 3d facing the wiring member 7. The semiconductor device according to the second embodiment differs from the first embodiment in including the metal plate 3d having the first groove portions 15a and the second groove portions 15b separately on the lower surface and the upper surface, respectively. The other configurations are the same as those of the semiconductor device according to the first embodiment, and thus, redundant descriptions will be omitted.

Figure 26:
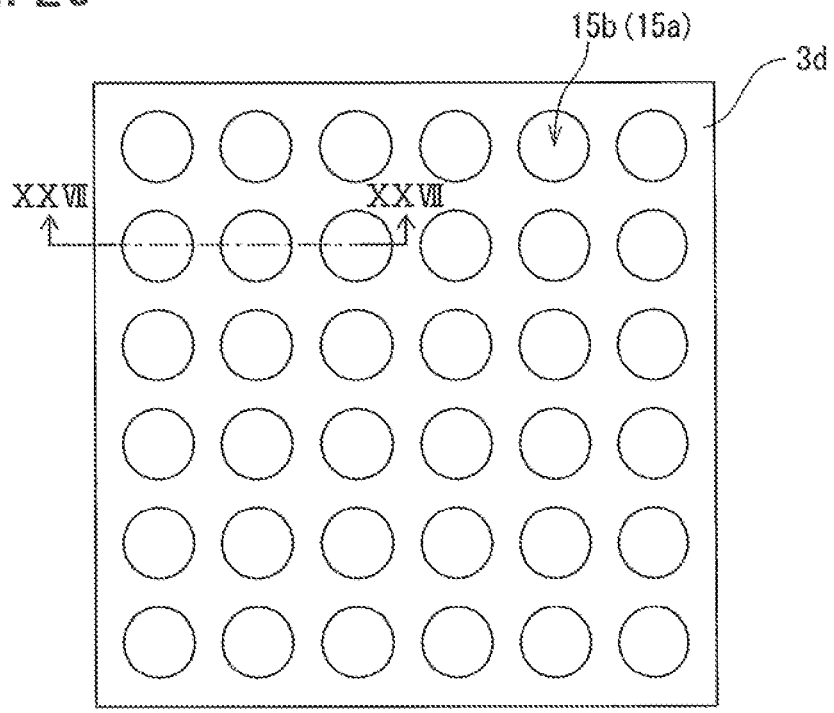
FIG. 26 is a schematic plan view illustrating an example of a metal plate according to the second embodiment.
Figure 27:
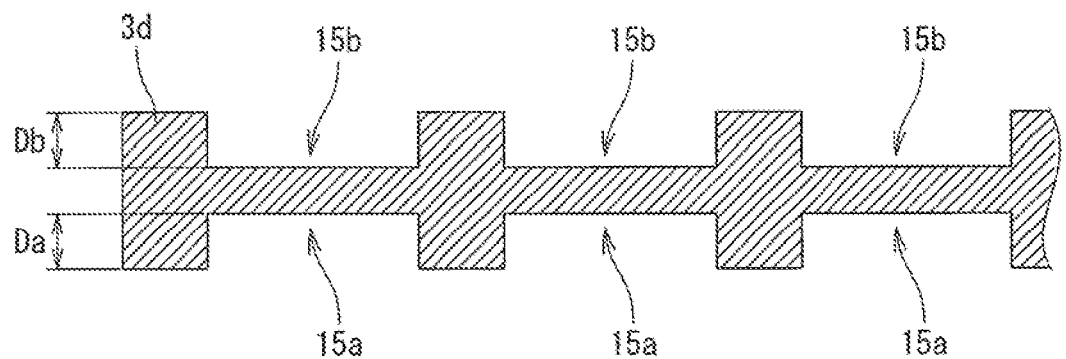
FIG. 27 is a cross-sectional view taken along a line XXVII-XXVII in FIG. 26.

As illustrated in FIG. 26, in the metal plate 3d, the first groove portions 15a having a circular shape provided on the lower surface and the second groove portions 15b having a circular shape provided on the upper surface are arranged in a matrix in a plan view. Each shape of the first and second groove portions 15a, 15b is not limited to a circular shape, and may be an elliptical shape, a rectangular shape, a polygonal shape, or the like. Further, each arrangement of the first and second groove portions 15a, 15b is not limited to the matrix, and may be a striped arrangement or a random arrangement. As illustrated in FIG. 27, the first groove portions 15a are provided on one side of the metal plate 3d facing the semiconductor chip 1 and each has a depth Da. The second groove portions 15b are provided on another side of the metal plate 3d facing the wiring member 7 and each has a depth Db. The depth Da and the depth Db may be the same or different from each other. For a material of the metal plate 3d, a metal, such as Ag or Au, may be desirable in consideration of joining with the sintered metal layers 4e, 4f containing the Ag particles, the Ag powder and the like. Further, the metal plate 3d may be a metal plate made of Cu, Al, Al alloy or the like, in which a surface is Ag-plated or Au-plated.

In the semiconductor device according to the second embodiment, the strengths of the sintered metal layers 4e, 4f are controlled by using the metal plates 3d having the first and second groove portions 15a and 15b between the sintered metal layers 4e and 4f. The sintering densities of the sintered metal layers 4e, 4f are controlled so that the strengths of the sintered metal layers 4e, 4f are equal to or less than that of the electrode metal layer 1B of the semiconductor chip 1, and the stress generated when the semiconductor device is energized may be dispersed in the joint portion 2b. As illustrated in FIG. 19, the yield stress is about 27 MPa for the Al metal and about 35 MPa for the Al-1.0% Si alloy. Therefore, the strengths of the sintered metal layers 4e, 4f are controlled in a range of about 20 MPa or more and about 40 MPa or less. As illustrated in FIG. 15, in order to control the strengths of the sintered metal layers 4e and 4f in the range of about 20 MPa or more and about 40 MPa or less, the sintering densities may be in a range of about 72% or more and about 78% or less. Alternatively, as illustrated in FIG. 17, in order to control the strengths of the sintered metal layers 4e, 4f in the range of about 20 MPa or more and about 40 MPa or less, the compression rates may be in a range of about 10% or more and about 20% or less.

A thickness Tm of the metal plate 3d is desirably less than 50% of the supply-thickness. When the thickness Tm of the metal plate 3d is 50% or more of the supply-thickness, each compression rate of the sintered metal layers 4e, 4f in the regions of the metal plate 3d other than the first and second groove portions 15a, 15b may increase, and thus, the pressurization to the regions of the first and second groove portions 15a, 15b may be insufficient. In such case, the contact area between the semiconductor chip 1 and the insulated circuit board 8 may be reduced, the joint strength may be decreased and the thermal resistance may be increased. Further, in case any metal plate is not used, the conventional method for heating and pressurizing a sintered metal layer have to be adopted. For example, when a plurality of semiconductor chips having different thicknesses are used, or when a semiconductor chip having warpage or inclination is used, it is difficult to control the sintering density because the pressurization may be excessive or insufficient by the position. Therefore, the thickness Tm of the metal plate 3d is required to some extent. Moreover, the depths Da, Db of the first and second groove portions 15a, 15b are preferably larger than 0 and smaller than the thickness Tm of the metal plate 3d.

In the second embodiment, in joining between the semiconductor chip 1 and the wiring member 7, the strengths of the sintered metal layers 4e, 4f in the respective regions of the first and second groove portions 15a, 15b illustrated in FIG. 25 are controlled in the range of 20 MPa or more and 40 MPa or less, for example, about 35 MPa. In such case, the sintering density corresponds to about 76% and the compression rate corresponds to about 18%. For example, when each supply-thickness of the sintered metal layers 4e, 4f is about 100 μm, a laminate-thickness Tsa of the sintered metal layer 4e and a laminate-thickness Tsb of the sintered metal layer 4f illustrated in FIG. 25 are about 82 μm, respectively, that is, the amount of deformation due to compression is about 18 μm. When the respective depths Da, Db of the first and second groove portions 15a, 15b are more than 0 and less than the thickness Tm of the metal plate 3d, the sintering densities of the sintered metal layer 4e, 4f in the regions of the metal plate 3d other than the first and second groove portions 15a, 15b are greater than about 76% and less than about 90%.

In the semiconductor device according to the second embodiment, as illustrated in FIG. 25, the metal plate 3d having the first and second groove portions 15a, 15b is provided between the sintered metal layer 4e and the sintered metal layer 4f. The stress generated during energization is dispersed in the joint portion 2b. The sintered metal layers 4e, 4f in the regions of the metal plate 3d other than the first and second groove portions 15a, 15b have higher strength than the sintered metal layers 4e, 4f in the regions of the first and second groove portions 15a, 15b. In the sintered metal layers 4e, 4f, the regions of the first and second groove portions 15a, 15b, in which the strengths are lower, are localized surrounded by the regions of the metal plate 3d other than the first and second groove portions 15a, 15b, in which the strengths are higher. Therefore, even if the cracks occur in the sintered metal layers 4e, 4f in the regions of the first and second groove portions 15a and 15b, it is possible to prevent from extending to the entire sintered metal layers 4e, 4f.

The depth Db of the second groove portion 15b of the metal plate 3d is desirably deeper than the depth Da of the first groove portion 15a of the metal plate 3d. When the second groove portion 15b is deeper than the first groove portion 15a, the strength of the sintered metal layer 4f may be smaller than that of the sintered metal layer 4e, and the cracks may occur in the sintered metal layer 4f between the wiring member 7 and the metal plate 3d to prevent from extending toward the semiconductor chip 1. As a result, deterioration of the semiconductor chip 1 can be prevented, and the reliability of the semiconductor device can be improved.

In a planar pattern, each occupied area of the first groove portion 15a and the second groove portion 15b is desirably 25% or more and 75% or less with respect to the total area of the metal plate 3d including the upper surface of the metal plate 3d and the openings of the first groove portions 15a or the lower surface of the metal plate 3d and the openings of the second groove portions 15b. Further, the thickness Tb of the sintered metal layer 4f between the upper surface of the metal plate 3d and the wiring member 7 is desirably thicker than the thickness Ta of the sintered metal layer 4e between the lower surface of the metal plate 3d and the semiconductor chip 1. When the sintered metal layer 4f is thicker than the sintered metal layer 4e, the strength of the sintered metal layer 4f may be smaller than that of the sintered metal layer 4e, and the cracks may occur in the sintered metal layer 4f between the wiring member 7 and the metal plate 3d, and it is possible to prevent the cracks from extending toward the semiconductor chip 1.

Figure 28:
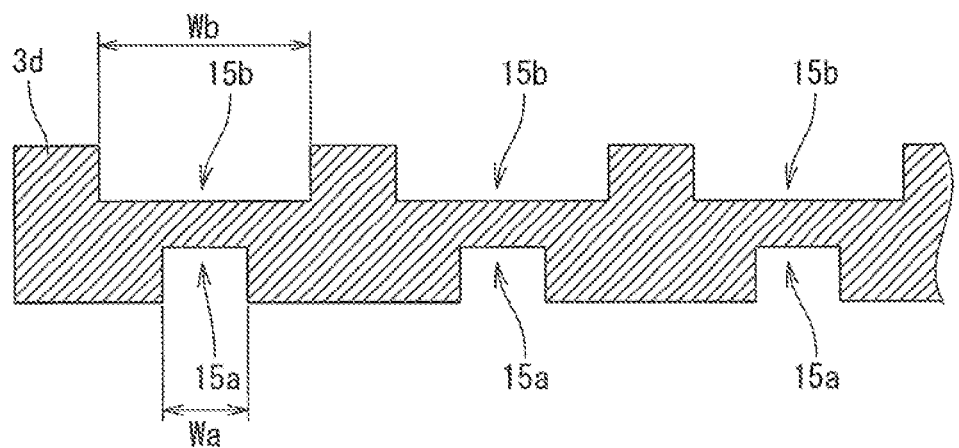
FIG. 28 is a schematic cross-sectional view illustrating another example of a metal plate according to the second embodiment.

Further, in order to lower the strength of the sintered metal layer 4f on the wiring member 7 as compared with the sintered metal layer 4e on the semiconductor chip 1, as illustrated in FIG. 28, opening areas of the first and second groove portions 15a, 15b in the metal plate 3d may be adjusted. An opening size Wa of the first groove portion 15a facing the semiconductor chip 1 is smaller than an opening size Wb of the second groove portion 15b facing the wiring member 7. Therefore, the strength of the sintered metal layer 4f on the wiring member 7 may be smaller than that of the sintered metal layer 4e on the semiconductor chip 1 side.

Similarly, in joining the semiconductor chip 1 and the wiring layer 82a of the insulated circuit board 8 as illustrated in FIG. 24, the joint portion 2c has a structure in which a metal plate having the first and second groove portions 15a, 15b illustrated in FIG. 25 is arranged between sintered metal layers. The strengths of the sintered metal layers in the respective regions of the first and second groove portions 15a, 15b are controlled in the range of 20 MPa or more and 40 MPa or less, for example, about 35 MPa. For example, when each supply-thickness of the sintered metal layers is about 100 μm, the laminate-thicknesses Tsa and Tsb illustrated in FIG. 25 are about 82 μm, respectively, that is, the amount of deformation due to compression is about 18 μm. In such case, the sintering density corresponds to about 76% and the compression rate corresponds to about 18%. Further, the thickness Tm of the metal plate is preferably less than 50% of the supply-thickness.

Further, the thickness of the sintered metal layer between the metal plate in the joint portion 2c and the wiring layer 82a of the insulated circuit board 8 is desirably thicker as compared with the thickness of the other sintered metal layer between the metal plate in the joint portion 2c and the semiconductor chip 1, as illustrated in FIG. 24. When the sintered metal layer on the insulated circuit board 8 side is thicker, the strength of the sintered metal layer on the insulated circuit board 8 may be smaller than the other sintered metal layer on the semiconductor chip 1, Thus, the cracks may occur in the sintered metal layer in the joint portion 2c on the wiring layer 82a, and it is possible to prevent the cracks from extending toward the semiconductor chip 1. In addition, in the first embodiment and the second embodiment, the metal plate (metallic member) 3, 3d may be made of any one of metal particles, metallic fibers, and metallic nets.

Other Embodiments

While the present invention has been described above by reference to the embodiments and modified examples, it should be understood that the present invention is not intended to be limited to the descriptions of the Specification and the drawings implementing part of this disclosure. Various alternative embodiments, examples, and technical applications will be apparent to those skilled in the art according to the spirit and scope of the disclosure of the embodiments. It should be noted that the present invention includes various embodiments, which are not disclosed herein, including elements optionally modified as alternatives to those illustrated in the above embodiments and modified examples. Therefore, the scope of the present invention is defined only by the subject matter according to the claims reasonably derived from the description heretofore.

What is claimed is:

1. A semiconductor device comprising:
   a first semiconductor chip having a metal layer on a top surface;
   a first wiring member arranged to face the metal layer;
   a sintered-metal layer arranged between the metal layer and the first wiring member, having a first region and a plurality of second regions, each of the second regions having lower tensile strength than the first region; and
   a metallic member arranged inside the sintered-metal layer, wherein
   the second regions of the sintered-metal layer have lower tensile strength than the metal layer of the first semiconductor chip.

2. The semiconductor device according to claim 1, wherein the metallic member comprises a first metal plate having a plurality of first groove portions on a lower surface and a plurality of second groove portions on an upper surface, the first metal plate having a plane portion on each of the lower surface and the upper surface where the first groove portions and the second groove portions are not provided, and
   the sintered-metal layer includes a first sintered-metal layer arranged between the metallic member and the first semiconductor chip so as to fill in the first groove portions, and a second sintered-metal layer arranged between the metallic member and the first wiring member so as to fill in the second groove portions.

3. The semiconductor device according to claim 2, wherein the first groove portions and the second groove portions are connected to each other so as to implement a plurality of through holes.

4. The semiconductor device according to claim 2, wherein each sintering density of the first sintered-metal layer and the second sintered-metal layer in respective regions of the first groove portions and the second groove portions is in a range of 72% or more and 78% or less.

5. The semiconductor device according to claim 2, wherein
   the first sintered-metal layer has higher sintering density on the lower surface of the first metal plate than in the first groove portions of the first metal plate, and
   the second sintered-metal layer has higher sintering density on the upper surface of the first metal plate than in the second groove portions of the first metal plate.

6. The semiconductor device according to claim 2, wherein the first sintered-metal layers in the first groove regions have higher sintering density than the second sintered-metal layers in the second groove regions.

7. The semiconductor device according to claim 2, wherein, in a planar pattern, each of occupied areas of the first groove portions and the second groove portions is 25% or more and 75% or less with respect to a total surface area of the first metal plate, the occupied area being defined as a sum of surface areas of entire openings of the first groove portions or the second groove portions, and the total surface area being defined as a sum of a surface area of the first metal plate and the occupied area of the first groove portions or the second groove portions.

8. The semiconductor device according to claim 2, wherein, in a planar pattern, an occupied area of the first groove portions is smaller than an occupied area of the second groove portions, each occupied area being defined as a sum of surface areas of entire openings of the first groove portions or the second groove portions.

9. The semiconductor device according to claim 2, wherein a thickness of the first metal plate is in a range of more than 0% and 63% or less with respect to a thickness of the first sintered-metal layer from the top surface of the first semiconductor chip to each bottom of the first groove portions.

10. The semiconductor device according to claim 2, wherein a thickness of the first sintered-metal layer from the top surface of the first semiconductor chip to each bottom of the first groove portions is thinner than a thickness of the second sintered-metal layer from a lower surface of the first wiring member to each bottom of the second groove portions.

11. The semiconductor device according to claim 2, further comprising:
a second semiconductor chip;
a second metal plate arranged above the second semiconductor chip, having a plurality of third groove portions on a lower surface and a plurality of fourth groove portions on an upper surface;
a second wiring member arranged above the second metal plate;
a third sintered-metal layer arranged between the second semiconductor chip and the second metal plate so as to fill in the third groove portions; and
a fourth sintered-metal layer arranged between the second metal plate and the second wiring member so as to fill in the fourth groove portions, wherein
an upper surface of the first wiring member is at same level in height with an upper surface of the second wiring member.

12. The semiconductor device according to claim 11, wherein a thickness of the first metal plate differs from a thickness of the second metal plate.

13. The semiconductor device according to claim 11, further comprising:
a third metal plate arranged below the first semiconductor chip, having a plurality of fifth groove portions on an upper surface and a plurality of sixth groove portions on a lower surface;
an insulated circuit board arranged below the third metal plate, having a wiring layer on an upper surface;
a fifth sintered-metal layer arranged between the first semiconductor chip and the third metal plate so as to fill in the fifth groove portions; and
a sixth sintered-metal layer arranged between the third metal plate and the wiring layer so as to fill in the sixth groove portions.

14. The semiconductor device according to claim 1, wherein the metallic member is made of any one of a metal particle, a metal fiber, and a metal net.

\* \* \* \* \*